(12) United States Patent
Itazaki et al.

(10) Patent No.: US 11,145,773 B2
(45) Date of Patent: Oct. 12, 2021

(54) LIGHT RECEIVING ELEMENT UNIT

(71) Applicant: KYOTO SEMICONDUCTOR CO., LTD., Kyoto (JP)

(72) Inventors: Yu Itazaki, Kyoto (JP); Etsuji Omura, Kyoto (JP)

(73) Assignee: Kyoto Semiconductor Co., Ltd., Kyoto (JP)

( * ) Notice: Subject to any disclaimer, the term of this patent is extended or adjusted under 35 U.S.C. 154(b) by 50 days.

(21) Appl. No.: 16/620,616

(22) PCT Filed: Jul. 31, 2019

(86) PCT No.: PCT/JP2019/030078
§ 371 (c)(1),
(2) Date: Dec. 19, 2019

(87) PCT Pub. No.: WO2021/019744
PCT Pub. Date: Feb. 4, 2021

(65) Prior Publication Data
US 2021/0249547 A1    Aug. 12, 2021

(51) Int. Cl.
*H01L 31/0352* (2006.01)
*H01L 25/04* (2014.01)
*H01L 31/0304* (2006.01)
*H01L 31/02* (2006.01)
*H01L 31/028* (2006.01)
*H01L 31/0216* (2014.01)

(52) U.S. Cl.
CPC .... *H01L 31/035281* (2013.01); *H01L 25/043* (2013.01); *H01L 31/02005* (2013.01); *H01L 31/028* (2013.01); *H01L 31/02161* (2013.01); *H01L 31/0304* (2013.01)

(58) Field of Classification Search
CPC ....... H01L 31/035281; H01L 31/02005; H01L 25/043; H01L 31/0304; H01L 31/02161; H01L 31/028
See application file for complete search history.

(56) References Cited

U.S. PATENT DOCUMENTS

| 6,373,117 B1 | 4/2002 | Theil |
| 2005/0110105 A1* | 5/2005 | Kuhara ................. H01L 25/043 257/432 |

(Continued)

FOREIGN PATENT DOCUMENTS

| CN | 102473790 A | 5/2012 |
| JP | 2001-007310 A | 1/2001 |

(Continued)

*Primary Examiner* — Hoang-Quan Ho
(74) *Attorney, Agent, or Firm* — Norris McLaughlin, P.A.

(57) ABSTRACT

The light receiving element unit includes a first light receiving element having a light receiving region on the main surface side of the first semiconductor substrate and a second light receiving element having a light receiving region on the main surface side of the second semiconductor substrate, and a support substrate having wiring for electrically connecting the first light receiving element and the second light receiving element to the outside, one of the first light receiving element and the second light receiving element has a recess formed in a concave shape from the back surface opposite to the light receiving region toward the light receiving region, and the other is accommodated in the recess.

7 Claims, 8 Drawing Sheets

(56) References Cited

U.S. PATENT DOCUMENTS

| | | |
|---|---|---|
| 2006/0043297 A1 | 3/2006 | Ouvrier-Buffet et al. |
| 2015/0236478 A1 | 8/2015 | Huang et al. |
| 2018/0190697 A1 | 7/2018 | Lee et al. |
| 2019/0006550 A1 | 1/2019 | Fujii |

FOREIGN PATENT DOCUMENTS

| | | |
|---|---|---|
| JP | 2007-221088 A | 8/2007 |
| JP | 2009-236954 A | 10/2009 |
| JP | 2011-023400 A | 2/2011 |
| JP | 2011-192873 A | 9/2011 |
| JP | 2019-012713 A | 1/2019 |

* cited by examiner

LIGHT RECEIVING ELEMENT UNIT

TECHNICAL FIELD

The present invention relates to a light receiving element unit having two types of light receiving elements that convert light of different wavelength ranges into electrical signals in order to detect light having a wide range of wavelengths.

BACKGROUND ART

Conventionally, a light receiving element unit having a plurality of light receiving elements capable of detecting different wavelengths has been used in order to detect light having a wide wavelength range and convert it into electrical signals. Such a light receiving element unit is formed by arranging a plurality of light receiving elements on a support substrate, and the incident axis of incident light is different for each light receiving element. In optical communication using an optical fiber, optical signals having different wavelengths are transmitted through the same optical fiber and emitted from the receiving end of the optical fiber. When the light receiving element unit described above is used for this optical communication, the light is diffracted by the wavelength and is incident on the corresponding light receiving element.

A light-receiving element unit having a plurality of light-receiving elements requires a large width when the light receiving elements are arranged side by side, and also requires a mechanism for diffracting. And thus, it is impossible to miniaturize so as to contain in the optical communication device. Therefore, for example, as shown in Patent Documents #1 and #2, a technique is known in which two light receiving elements are stacked so that light transmitted through one light receiving element is incident on the other light receiving element.

PRIOR ART DOCUMENTS

Patent Documents

Patent Document #1: Japanese Laid-Open Patent Publication 2011-192873. Patent Document #2: Japanese Laid-Open Patent Publication 2019-12713.

SUMMARY OF THE INVENTION

Technical Problem

However, since the thickness increases when two light receiving elements are stacked as shown in Patent Documents #1 and #2, the light receiving element unit become enlarged. Therefore, it is conceivable to suppress an increase in thickness by stacking two light receiving elements that are thinned by processing such as polishing.

Here, when two light receiving elements are stacked, the second light receiving element on the opposite side to the incident side converts the light transmitted through the first light receiving element on the light incident side into an electric signal. Therefore, the light receiving element for a longer wavelength is the second light receiving element. That is, the first light receiving element is a light receiving element for a short wavelength, and the second light receiving element is for a long wavelength that passed without being absorbed by the first light receiving element.

For example, a silicon substrate is used for the first light receiving element and an indium phosphide substrate is used for the second light receiving element, or a gallium nitride substrate is used for the first light receiving element, and the a silicon substrate is used for the second light receiving element. As a result, the first light receiving element receives incident light of the short wavelength, and the second light receiving element receives incident light of the long wavelength transmitted through the first light receiving element.

A light receiving element using an indium phosphide substrate or a gallium nitride-based substrate is higher in manufacturing cost than a light receiving element using a silicon substrate, and therefore it is desired to reduce the size. On the other hand, since the thinning process for thinning the substrate increases the possibility of causing defects such as cracks in the light receiving element, one of the first and second light receiving elements is required not to be thinned so much or not at all. In this case, even if the first and second light receiving elements are stacked, the thickness cannot be sufficiently suppressed, and it is not easy to reduce the size.

An object of the present invention is to provide a light receiving element unit that is reduced in size by stacking two light receiving elements.

Means to Solve the Problems

The present invention presents a light receiving element unit comprising a first light receiving element having a light receiving region on a first main surface side of a first semiconductor substrate; a second light receiving element having a light receiving region on a second main surface side of the second semiconductor substrate; and a support substrate having wirings for electrically connecting the first light receiving element and the second light receiving element to an outside, wherein; one of the first light receiving element and the second light receiving element has a recess formed in a concave shape from a back surface opposite to the light receiving region toward the light receiving region, and the other is accommodated in the recess.

Accordingly, the light receiving element unit has the first light receiving element and the second light receiving element, one of which has the concave recess on the opposite side to the main surface where the light receiving region is located, and the other is accommodated in the recess. Therefore, two light receiving elements are stacked in order to receive light in a wide wavelength range, and the thickness of the light receiving element unit can be reduced by the concave recess, thereby reducing the size of the light receiving element unit.

In a preferable first aspect, the first light receiving element and the second light receiving element are arranged such that light transmitted through the light receiving region of the first light receiving element is incident to the light receiving region of the second light receiving element.

Accordingly, since the light receiving element unit can receive incident light having different wavelengths without diffracting the light, and thus the light receiving element unit can be miniaturized.

In a preferable second aspect, the first light receiving element comprises an antireflection layer on an entrance side and an exit side of incident light, respectively.

Accordingly, the reflection of the incident light of the first light receiving element on the entrance side is suppressed to secure the amount of light received by the first and second light receiving elements, and, the amount of light received by the second light receiving element can be secured by suppressing light reflection on the exit side of the incident light transmitted through the first light receiving element.

In a preferable third aspect, the first light receiving element has the recess, and a recess side of the first light receiving element is fixed to the support substrate, the second light receiving element comprises an electrodes on the second main surface of the second semiconductor substrate, and the electrodes are fixed to corresponding wirings of the support substrate by solidified conductive member.

Accordingly, the second light receiving element can be accommodated in the concave recess of the first light receiving element to reduce the size of the light receiving element unit, and at the same time the second light receiving element is fixed to the support substrate and is electrically connected, the manufacturing of the light receiving element unit can be facilitated.

In a preferable fourth aspect, the first light receiving element has the recess and intermediate wirings formed on a recess side surface and connected to corresponding wirings of the support substrate, and the recess side surface is fixed to the support substrate, the second light receiving element has electrodes on the second main surface of the second semiconductor substrate, and the electrodes are fixed to corresponding intermediate wirings of the first light receiving element by a conductive member solidified.

Accordingly, the second light receiving element can be accommodated in the recess of the first light receiving element to reduce the size of the light receiving element unit, and the second light receiving element is fixed to the first light receiving element and is electrically connected to the corresponding intermediate wiring, and the first light receiving element is fixed to the support substrate, the intermediate wirings are connected to the corresponding wirings on the support substrate.

In a preferable fifth aspect, the second light receiving element has the recess and intermediate wirings formed on a recess side surface and connected to corresponding wirings of the support substrate by conductive wires, and an opposite side surface of the recess is fixed to the support substrate, the first light receiving element has electrodes on the first main surface of the first semiconductor substrate, and the electrodes are connected to corresponding intermediate wirings by conductive wires in a state where an opposite side surface of the electrodes is fixed to the recess side surface.

Accordingly, the light receiving element unit can be reduced in size by accommodating the first light receiving element in the recess of the second light receiving element.

In a preferable sixth aspect, the first semiconductor substrate is a silicon substrate, and the second semiconductor substrate is an indium phosphide substrate.

Accordingly, the first light receiving element mainly receives the incident light in the visible light region without diffracting the incident light, and the second light receiving element can receive the light of infrared light region transmitted through the first light receiving element. Therefore, the size of the light receiving element unit can be reduced.

Advantages of the Invention

According to the light receiving element unit of the present invention, the light receiving element unit can be reduced in size by stacking two light receiving elements.

DESCRIPTION OF EMBODIMENTS

Best mode for implementing the present invention will now be explained on the basis of embodiments.

First Embodiment

Figure 1:
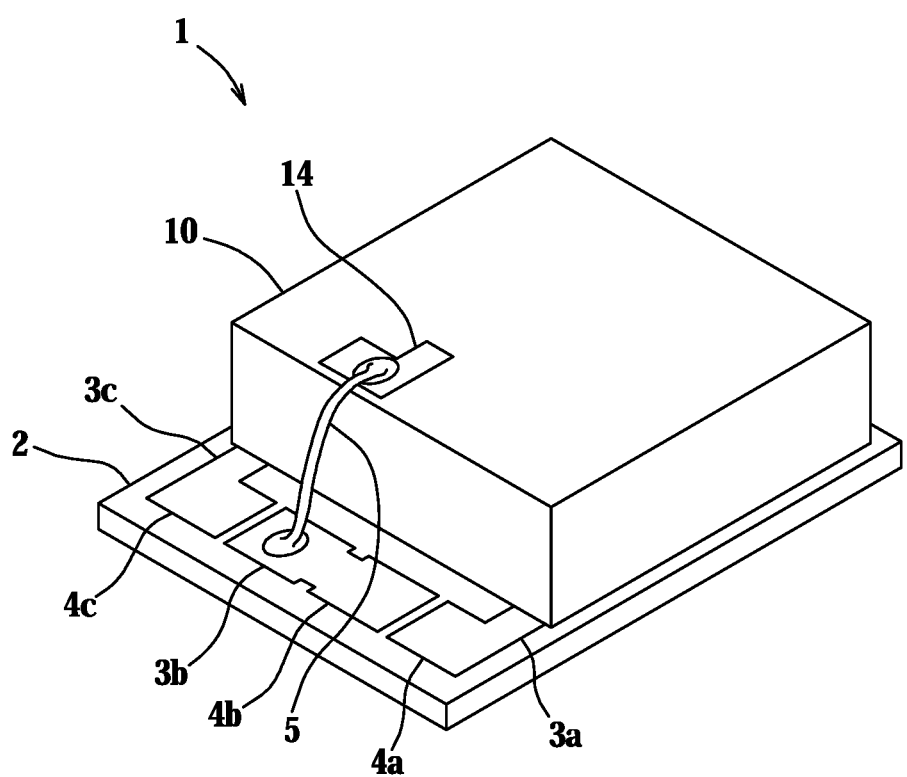
FIG. 1 is a perspective view of a light receiving element unit according to Embodiments 1 and 2 of the present invention.
Figure 2:
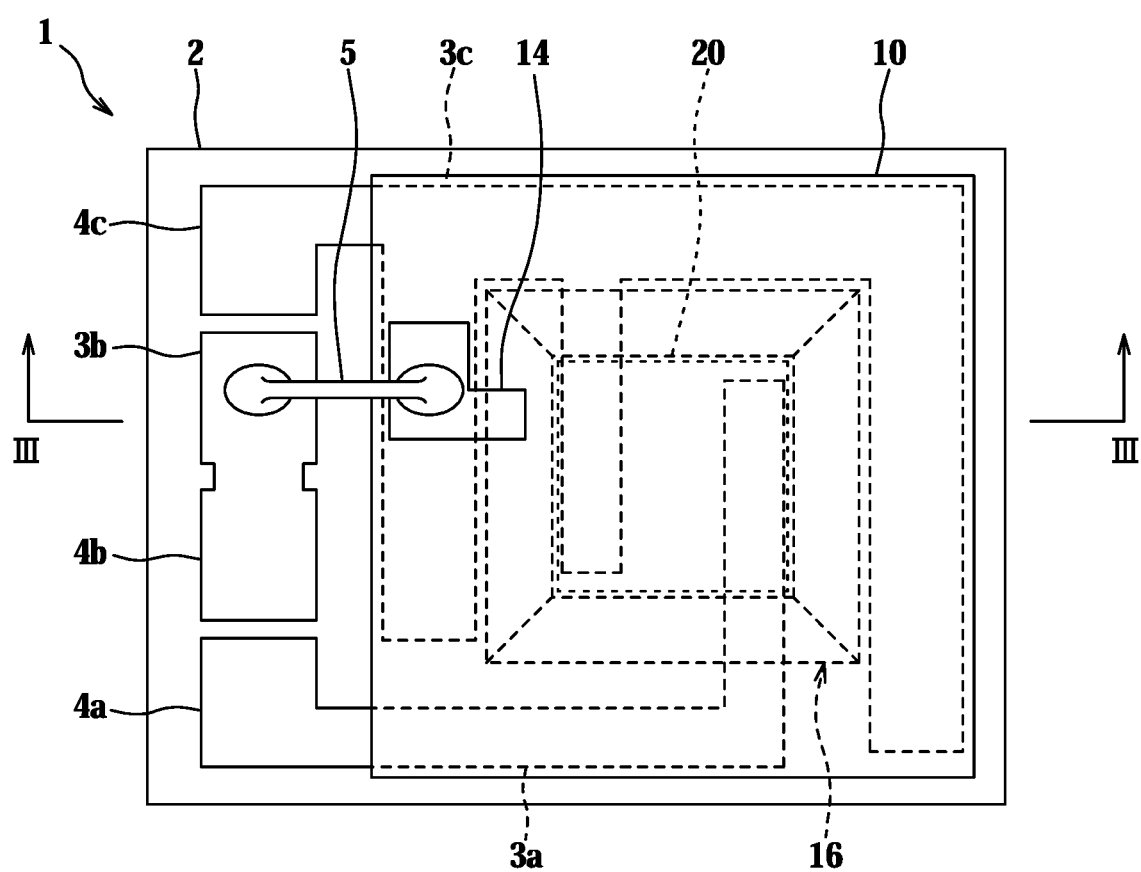
FIG. 2 is a plan view of the light receiving element unit according to Embodiment 1.
Figure 3:
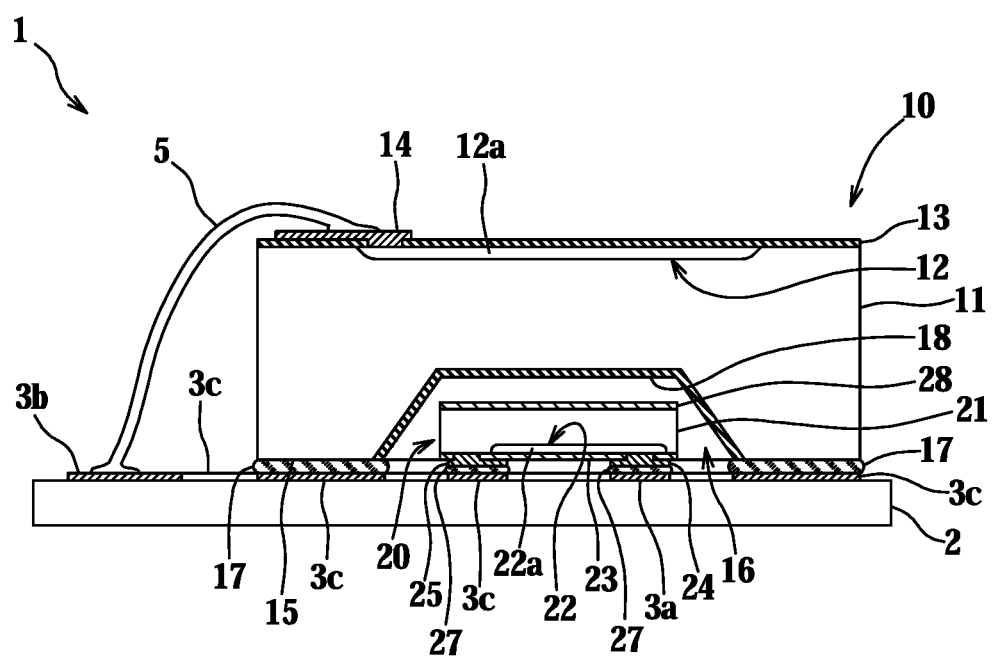
FIG. 3 is a cross-sectional view taken along line III-III in FIG. 2.

FIG. 1 shows the appearance of the light receiving element unit 1, FIG. 2 shows the light receiving element unit 1 viewed from the direction in which light enters, and FIG. 3 shows a sectional view of the essential portion of the light receiving element unit 1.

As shown in FIGS. 1 to 3, the light receiving element unit 1 comprises a support substrate 2, a first light receiving element 10, and a second light receiving element 20 accommodated in a recess 16 of the first light receiving element 10. A plurality of wirings 3a to 3c for electrically connecting the first light receiving element 10 and the second light receiving element 20 to an outside device are formed on the support substrate 2, and these wirings 3a to 3c comprises pad portions 4a to 4c for connection with the outside device. Incident light enters the first light receiving element 10 from a side opposite to the support substrate 2.

The first light receiving element 10 will be explained.

The first light receiving element 10 has a first light receiving region 12 on a main surface side of, for example, a silicon substrate 11 (hereinafter, Si substrate) as a first semiconductor substrate, and the first light receiving element 10 is a photo diode that mainly receives incident light in the visible light region. The Si substrate 11 is, for example, n type, and a p type diffusion region 12a doped with, for example, boron is formed on the main surface side of the n type Si substrate 11 which is the entering side of incident light. This main surface is covered with a antireflection layer 13 having a predetermined thickness (a silicon nitride film or a silicon oxide film having a thickness of 160 nm). The material and thickness of the antireflection layer 13 are appropriately set.

A first anode electrode 14 is formed by selectively depositing, for example, an electrode material mainly containing aluminum or gold on a predetermined region including an opening formed in the antireflection layer 13 so as to communicate with the p type diffusion region 12a. The exposed back surface opposite to the main surface of the n type Si substrate 11 is a first cathode electrode 15. The first anode electrode 14 is connected to the corresponding wiring 3b of the support substrate 2 by, for example, a gold wire 5 (conductive wire). The first cathode electrode 15 is fixed and electrically connected to the corresponding wiring 3c of the support substrate 2 by a conductive member 17 (for example, conductive adhesive containing silver particles, eutectic solder, gold bump, etc.) solidified by drying or cooling.

Although not shown in the drawings, the first cathode electrode 15 may be made to have a low resistance by doping, for example, phosphorus on the back surface side of the Si substrate 11, and may be mainly formed by attaching an electrode material containing aluminum or gold. Although not shown, the first cathode electrode connected to the main surface of the n type Si substrate 11 outside the p-type diffusion region 12a through the opening formed in the antireflection layer 13 is may be fixed and connected to the corresponding wiring 3c.

The vicinity of the pn junction formed by the n-type Si substrate 11 and the p-type diffusion region 12a is the first light receiving region 12, and incident light is converted into electric charges. This electric charge is transmitted to the outside as a current (electric signal) through the first anode electrode 14 and the first cathode electrode 15. The first light receiving region 12 has a width and length of, for example, about 2000 μm and a depth of about 10 μm, which are set as appropriate. Further, the first light receiving element 10 is formed in a rectangular shape having one side of, for example, about 3 mm, and the thickness thereof is, for example, about 250 to 400 μm without being thinned at all.

The main surface of the Si substrate 11 is on plane orientation (100). The Si substrate 11 includes the recess 16 formed in a concave shape inward of the Si substrate 11 from the back surface opposite to the p type diffusion region 12a toward the first light receiving region 12. An antireflection layer 18 having a predetermined thickness (for example, a silicon nitride film or a silicon oxide film having a thickness of 250 nm) is also formed on the inner surface of the recess 16 that is the exit side of incident light that passes through the first light receiving element 10. These antireflection layers 13 and 18 also function as an insulating protective layer.

The recess 16 is formed by selectively etching a region corresponding to the first light receiving region 12 from the back surface of the Si substrate 11. Although not shown, an etching mask having an opening corresponding to the first light receiving region 12 is formed on the back surface of the Si substrate 11, and an alkaline aqueous solution (for example, KOH aqueous solution or TMAH aqueous solution) is used as an etching solution.

At this time, the back surface of the Si substrate 11 is on plane orientation (100), and the Si (100) plane inside the Si substrate 11 is exposed as the etching proceeds. On the other hand, in the vicinity of the boundary with the region covered with the etching mask, the Si (111) plane whose etching rate is slower than the Si (100) plane is exposed due to the progress of etching, and the peripheral wall of the recess 16 is inclined. The recess 16 is formed in a quadrangular frustum pyramid shape by anisotropic etching utilizing the difference in etching rate. The recess 16 is formed to a depth of about 200 μm, for example, and this depth is easily controlled by the etching time.

The second light receiving element 20 will be explained.

The second light receiving element 20 includes a second light receiving region 22 on the main surface side of, for example, an indium phosphide substrate 21 (hereinafter, InP substrate) as a second semiconductor substrate. This is a photodiode that receives incident light in the infrared light region that has transmitted through the light receiving region 12 of the first light receiving element 10. The second light receiving element 20 is formed such that the width and length are smaller than the width and length of the recess 16 of the first light receiving element 10 and the thickness is smaller than the depth of the recess 16. The second light receiving element 20 is accommodated in the recess 16. For example, the second light receiving element 20 is formed in a rectangular shape with one side of about 1 mm, and is thinned to have a thickness of about 150 μm.

The InP substrate 21 is, for example, n type, and a p type region 22a mainly made of, for example, InGaAs is formed on the main surface side of the InP substrate 21. The main surface is covered with an antireflection layer 23 having a predetermined thickness (for example, a silicon nitride film or a silicon oxide film having a thickness of 250 nm), and the back surface opposite to the main surface is also covered with a similar antireflection layer 28.

Openings are respectively formed in the antireflection layer 23 so as to communicate with the second light receiving region 22 and the InP substrate 21 outside the second light receiving region 22, respectively. A second anode electrode 24 and a second cathode electrode 25 are formed by selectively depositing, for example, an electrode material mainly containing aluminium or gold.

The second anode electrode 24 and the second cathode electrode 25 are fixed to the corresponding wiring 3a, 3c on the support substrate 2 by a conductive member 27 (for example, conductive adhesive containing silver particles, eutectic solder, gold bumps, etc.) solidified by drying or cooling. Thereby, the second light receiving element 20 is fixed to the support substrate 2, and is electrically connected. Since the physical fixing and the electrical connection are performed simultaneously, the light receiving element unit 1 can be easily formed. Although not shown, the back side of the second light receiving element 20 may be fixed to the support substrate 2 with an adhesive or the like, and the second anode electrode 24 and the second cathode electrode 25 may be respectively connected to the corresponding wires 3a and 3c with gold wires or the like.

The vicinity of the pn junction formed by the n type InP substrate 21 and the p type diffusion region 22a is the second light receiving region 22, and incident light is converted into electric charges. This electric charge is transmitted to the outside as a current (electric signal) through the second anode electrode 24 and the second cathode electrode 25. The width and length of the second light receiving region 22 are, for example, about 800 μm and the depth is about 10 μm, and these are appropriately set. Note that the second light receiving element 20 may be a PIN photodiode.

The support substrate 2 will be explained.

The support substrate 2 is, for example, a ceramic substrate or a printed circuit board, and a plurality of wirings 3a to 3c are formed in portions where the electrodes of the first and second light receiving elements 10 and 20 are fixed. The plurality of wirings 3a to 3c are formed so as to easily electrically connect to the first and second anode electrodes 14 and 24 and the first and second cathode electrodes 15 and 25 of the first and second light receiving elements 10 and 20 from the outside. Pads 4a to 4c are provided for connection to the outside.

The second light receiving element 20 is fixed to the support substrate 2, the first light receiving element 10 is fixed to the support substrate 2 so as to accommodate the second light receiving element 20 in the recess 16, and thus the light receiving element unit 1 is formed. Accordingly, the first light receiving element 10 and the second light receiving element 20 are arranged so that the light transmitted through the first light receiving area 12 enters the second light receiving area 22.

Light enters the light receiving element unit 1 from the opposite side of the support substrate 2 to the first light receiving element 10, and in the first light receiving element 10, for example, the light of wavelength 400 to 1000 nm from the visible light region to the infrared light region is converted to electric current and transmitted to the outside as electric signals. Then, light having a wavelength of, for example, 1000 to 1600 nm transmitted through the first light receiving element 10 is incident on the second light receiving element 20, and this light is converted into current in the second light receiving element 20 and transmitted to the outside as electric signals.

In other words, the light receiving element unit 1 converts incident optical signals having significantly different wavelengths contained in incident light into electric signals without separation (diffraction) or filtering. Since the second light receiving element 20 is accommodated in the recess 16 of the first light receiving element 10, the light receiving element unit 1 is miniaturized to the same size as the light receiving unit including only the first light receiving element 10. Moreover, the manufacturing cost of the light receiving element unit 1 can be reduced by reducing the size of the second light receiving element 20. The light receiving element unit 1 is accommodated in a case (not shown) provided with a plurality of terminals respectively connected to the plurality of pad portions 4a to 4c of the support substrate 2 and a light incident window, this light receiving element unit can be used for optical communications.

Second Embodiment

Figure 4:
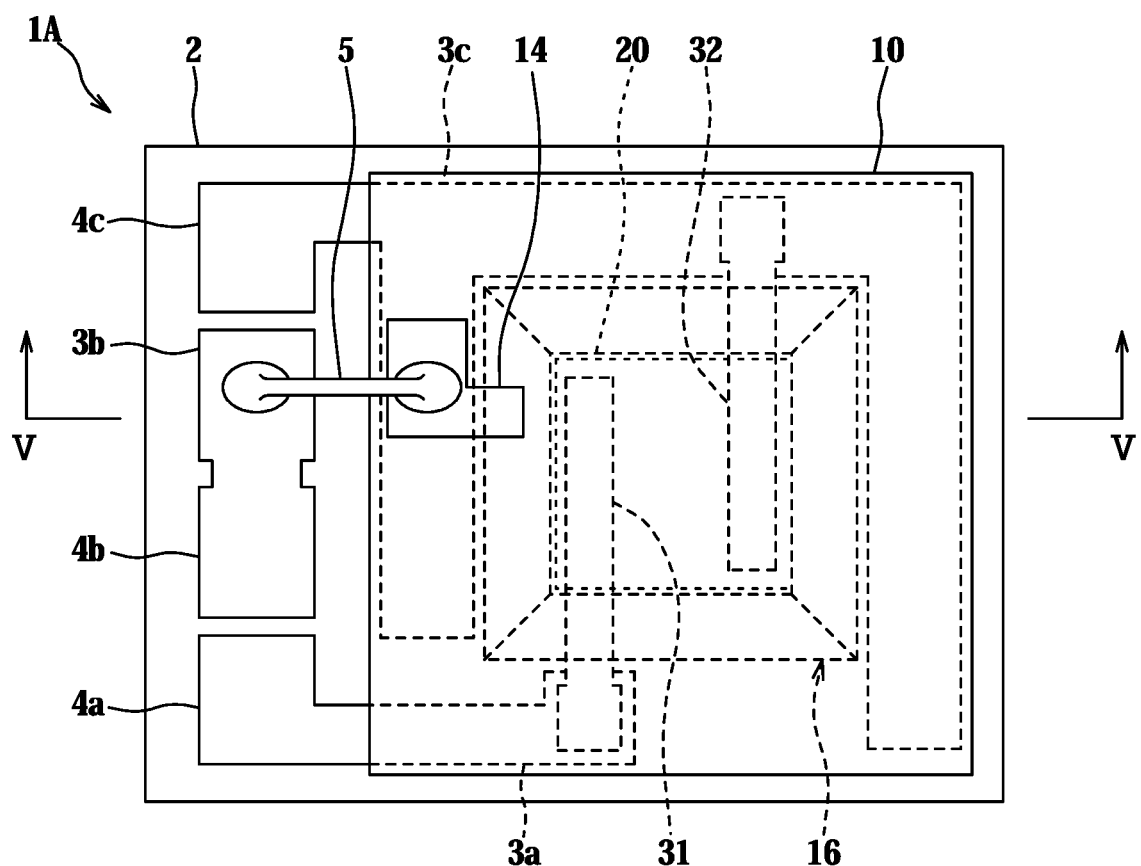
FIG. 4 is a plan view of the light receiving element unit according to Embodiment 2.
Figure 5:
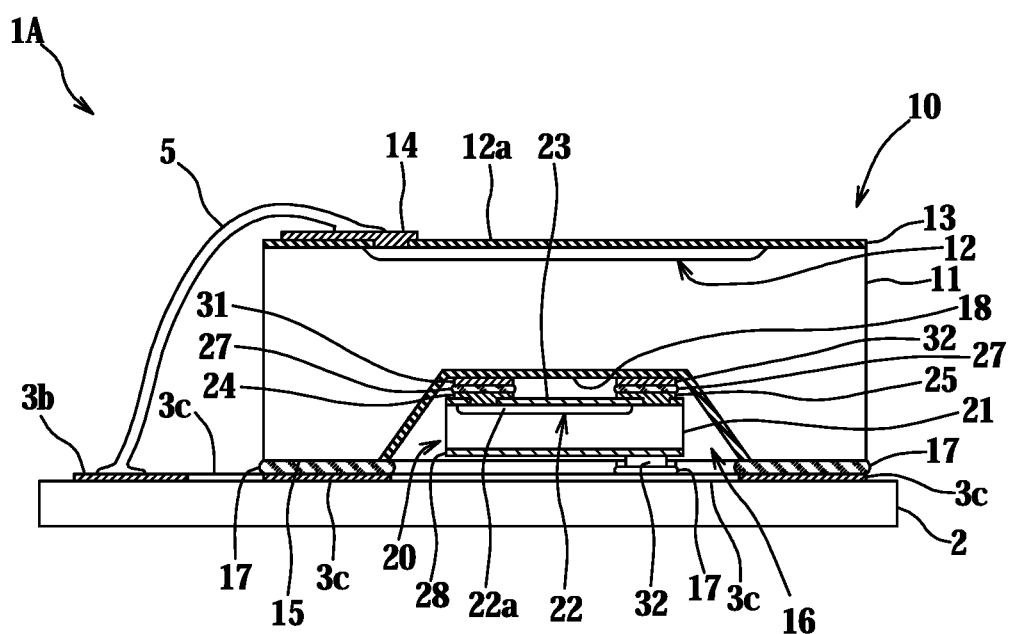
FIG. 5 is a cross-sectional view taken along line V-V in FIG. 4.

A second embodiment obtained by partially changing the first embodiment will be described with reference to FIGS. 1, 4, 5. FIG. 4 shows a light receiving element unit 1A viewed from the direction in which light enters, and FIG. 5 shows a sectional view of the essential portion of the light receiving element unit 1A. Since the first and second light receiving elements 10 and 20 are almost same light receiving elements as in the first embodiment, the same reference numerals as those in the first embodiment are used and the description thereof is omitted. On the inner surface of the recess 16 and the back surface of the Si substrate 11 of the first light receiving element 10, there are provided two intermediate wirings 31 and 32 for connecting the second anode electrode 24 and the second cathode electrode 25 of the second light receiving element 20 to corresponding wiring 3a, 3c of the support substrate 2. The intermediate wirings 31 and 32 are formed by selectively depositing a wiring material mainly including, for example, aluminum or gold on the antireflection layer 18.

The second anode electrode 24 and the second cathode electrode 25 of the second light receiving element 20 are fixed to the corresponding intermediate wirings 31 and 32 by the conductive member 27, respectively. Accordingly, the second light receiving element 20 is fixed and accommodated in the recess 16 of the first light receiving element 10 and is electrically connected to the intermediate wirings 31 and 32. Further, the light transmitted through the first light receiving region 12 is arranged to enter the second light receiving region 22.

The first cathode electrode 15 of the first light receiving element 10 in which the second light receiving element 20 is housed in the recess 16 is fixed to the corresponding wiring 3c of the support substrate 2 by the conductive member 17, so that the first cathode electrode 15 is electrically connected. And, the intermediate wirings 31 and 32 are also fixed and electrically connected to the corresponding wirings 3a and 3c by the conductive member 17, respectively.

Then, the first anode electrode 14 of the first light receiving element 10 is connected to the corresponding wiring 3b of the support substrate 2 by, for example, a gold wire 5 to form the light receiving element unit 1A. Since the second light receiving element 20 is accommodated in the recess 16 of the first light receiving element 10, the light receiving element unit 1A is miniaturized to the same size as the light receiving unit including only the first light receiving element 10. Moreover, the manufacturing cost of the light receiving element unit 1A can be reduced by reducing the size of the second light receiving element 20.

Third Embodiment

Figure 6:
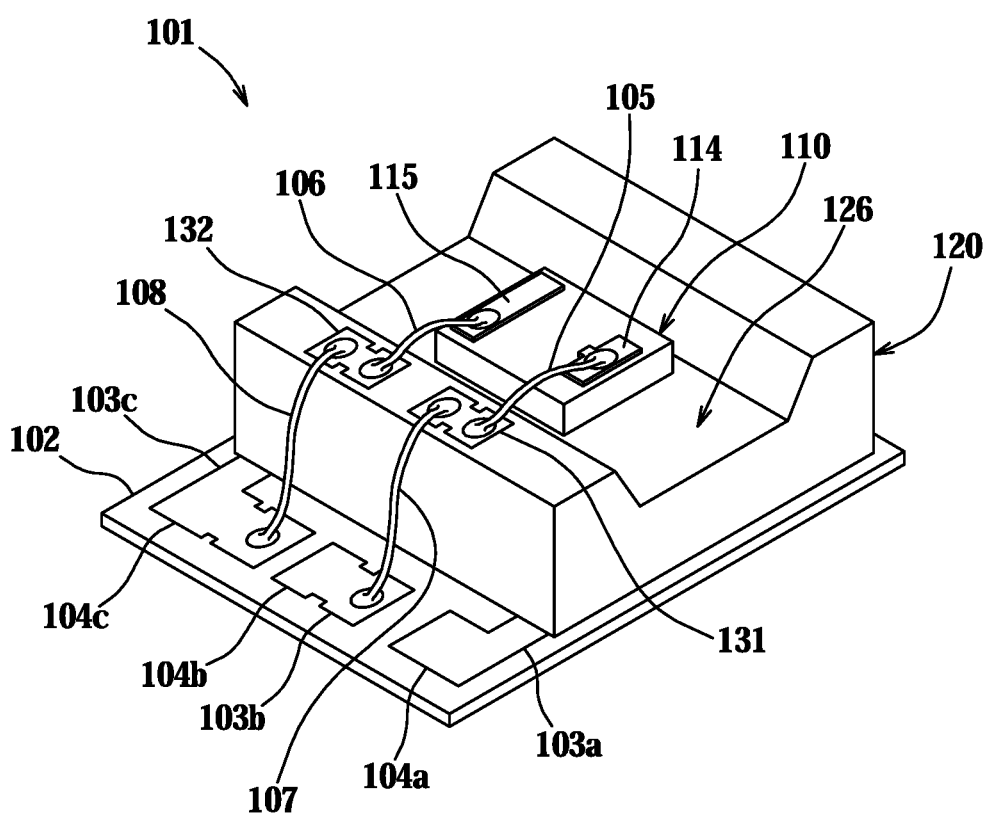
FIG. 6 is a perspective view of a light receiving element unit according to Embodiment 3.
Figure 7:
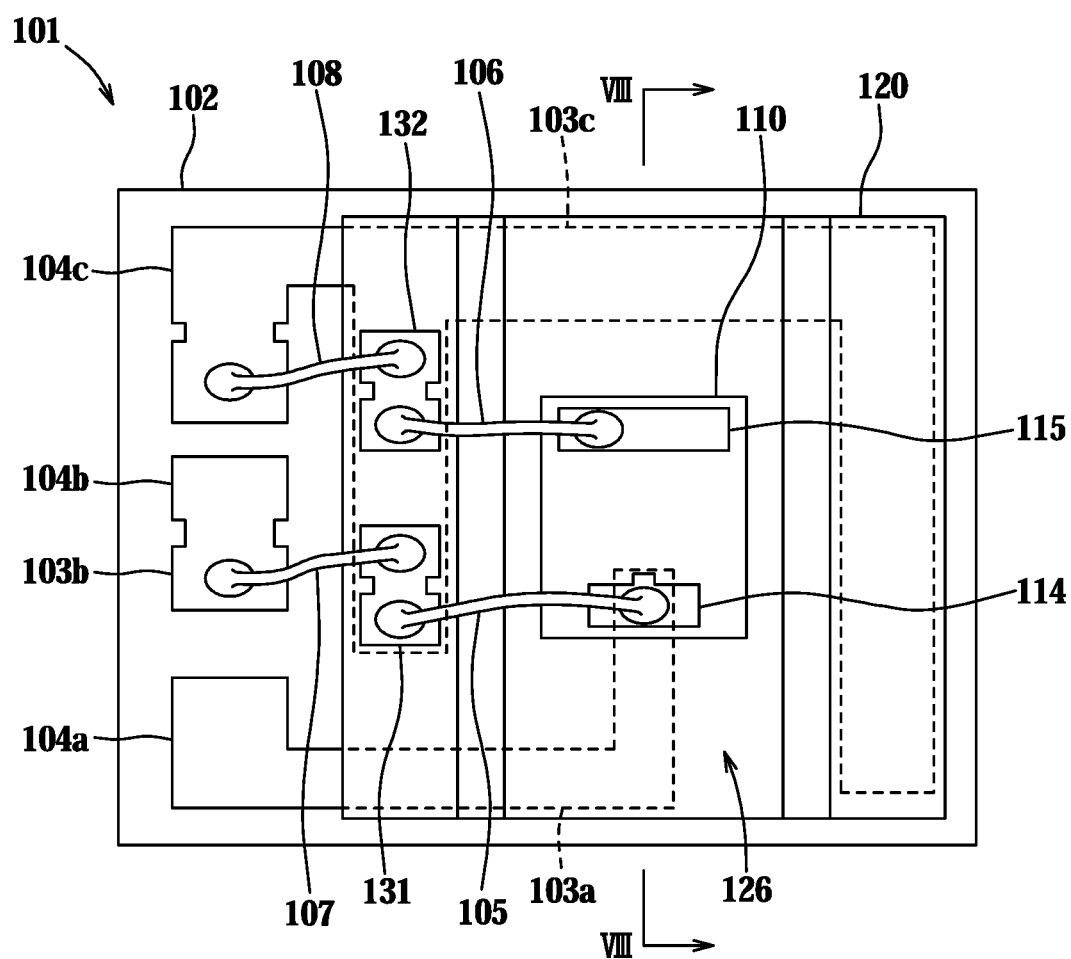
FIG. 7 is a plan view of the light receiving element unit according to Embodiment 3.
Figure 8:
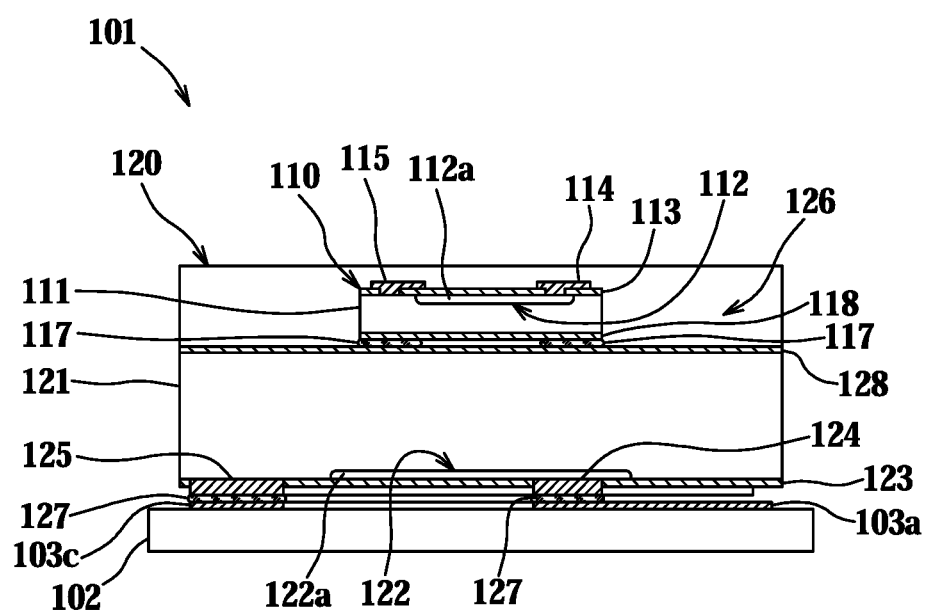
FIG. 8 is a cross-sectional view taken along line VIII-VIII in FIG. 7.

FIG. 6 shows an appearance of the light receiving element unit 101, FIG. 7 shows a light receiving element unit 101 viewed from the direction in which light is incident, and FIG. 8 shows the sectional view of the essential portion of the light receiving unit 101. As shown in FIGS. 6 to 8, the light receiving element unit 101 includes a support substrate 102, a first light receiving element 110, and a second light receiving element 120 in which the first light receiving element 110 is accommodated in the recess 126. A plurality of wirings 103a to 103c for connecting to the first light receiving element 110 and the second light receiving element 120 are formed on the support substrate 102, and these wirings 103a to 103c comprise pad portions 104a to 104c for connecting to the outside, respectively. Incident light enters the first light receiving element 110 from the side opposite to the support substrate 102.

The first light receiving element 110 will be explained.

The first light receiving element 110 is a photodiode that has a first light receiving region 112, for example, on the main surface side of the Si substrate 111 as a first semiconductor substrate and mainly receives incident light in the visible light region. The Si substrate 111 is, for example, n type, and a p type diffusion region 112a doped with, for example, boron is formed on the main surface side that is the entrance side of incident light of the n type Si substrate 111.

The first light receiving element 110 is formed such that its width and length are smaller than the width and length of the concave recess 126 of the second light receiving element 120 and its thickness is smaller than the depth of the recess 126. The first light receiving element 110 is accommodated in the recess 126. For example, the first light receiving element 110 is formed in a rectangular shape having one side of about 1 mm, and is thinned to have a thickness of about 150 μm.

The main surface on the entrance side of the incident light and the back surface on the exit side of the incident light transmitted through the first light receiving element 110 have antireflection layers 113 and 118 having a predetermined thickness (for example, a silicon nitride film or silicon oxide having a thickness of 160 nm). These antireflection layers 113 and 118 also function as an insulating protective layer. The material and thickness of the antireflection layers 113 and 118 are set as appropriate.

Openings are respectively provided in the antireflection layer 113 so as to communicate with the p type diffusion region 112a and the Si substrate 111 outside thereof. The first anode electrode 114 and the first cathode electrode 115 are formed by selectively depositing an electrode material mainly including, for example, aluminum or gold in each predetermined region including these openings.

The vicinity of the pn junction formed by the n type Si substrate 111 and the p type diffusion region 112a is the first light receiving region 112, and incident light is converted into electric charges. This electric charge is transmitted to the outside as a current (electric signal) through the first anode electrode 114 and the first cathode electrode 115. The first light receiving region 112 has a width and length of, for example, about 800 μm and a depth of about 10 μm, which are set as appropriate.

The second light receiving element 120 will be explained.

The second light receiving element 120 has, for example, a second light receiving region 122 on the main surface side of the InP substrate 121 as a second semiconductor substrate, and this second light receiving element unit 120 is a photodiode that receives an infrared light region transmitted through the first light receiving region 112 of the first light receiving element 110. The second light receiving element 120 is formed so as to be thicker than the first light receiving element 110 without being thinned. And in order to suppress the thickness when the first and second light receiving elements 110 and 120 are stacked, it has the recess 126 for accommodating the first light receiving element 110. The width and length of the second light receiving element 120 is larger than the width and length of the first light receiving element 110. For example, the second light receiving element 120 is formed in a rectangular shape having one side of about 3 mm and a thickness of about 250 to 400 μm.

The InP substrate 121 is, for example, n type, and a p type region 122a mainly made of, for example, InGaAs is formed on the main surface side of the InP substrate 121. This main surface is covered with an antireflection layer 123 having a predetermined thickness (for example, a silicon nitride film or a silicon oxide film having a thickness of 250 nm).

The InP substrate 121 includes the recess 126 formed in a concave shape inward of the InP substrate 121 from the back surface opposite to the p type region 122a toward the second light receiving region 122. The recess 126 is formed on the back surface of the InP substrate 121 so as to include a region corresponding to the second light receiving region 122 by, for example, machining, and has a width of about 1.2 to 1.5 mm and a length equal to the width or length of the second light receiving element 120. The recess 126 is a groove which is preferably formed so as to extend in a direction in which the second semiconductor substrate 121 is difficult to cleave.

The recess 126 is formed to a depth of, for example, about 200 μm, and the bottom thereof is subjected to a flattening process such as polishing in order to prevent scattering of incident light. An antireflection layer 128 having a predetermined thickness (for example, a silicon nitride film or a silicon oxide film having a thickness of 250 nm) is formed on the inner surface of the recess 126 and the back surface of the InP substrate 121. The antireflection layer 128 and the main surface side antireflection layer 123 also function as an insulating protective layer. On the antireflection layer 128 on the back side of the InP substrate 121, intermediate wirings 131 and 132 for connecting to the first anode electrode 114 and the first cathode electrode 115 of the first light receiving element 110 are formed.

The antireflection layer 123 on the main surface side of the InP substrate 121 is provided with openings so as to communicate with the second light receiving region 122 and the InP substrate 121 outside thereof. For example, an electrode material mainly containing aluminum or gold is selectively deposited in each predetermined region including these openings to form a second anode electrode 124 and a second cathode electrode 125. The second anode electrode 124 and the second cathode electrode 125 are fixed to corresponding wiring 103a, 103b by a conductive member 127 (for example, conductive adhesive containing silver particles, eutectic solder, gold bumps, etc.) which is solidified by drying or cooling. And thus, the second light receiving element 120 is fixed to the support substrate 102 and is also electrically connected to the corresponding wirings 103a and 103c of the support substrate 102.

The vicinity of the pn junction formed by the n type InP substrate 121 and the p type region 122a is the second light receiving region 122, and incident light is converted into electric charges. This electric charge is transmitted to the outside as a current (electric signal) through the second anode electrode 124 and the second cathode electrode 125. The width and length of the second light receiving region 122 are, for example, about 1500 μm and the depth is about 10 μm, and these are set as appropriate.

The support substrate 102 will be explained.

The support substrate 102 is, for example, a ceramic substrate or a printed circuit board, and a plurality of wirings 103a to 103c are formed in portions where the first and second light receiving elements 110 and 120 are electrically connected. The plurality of wirings 103a to 103c are provided with pad portions 104a to 104c so as to connect easily electrically to the first and second anode electrodes 114 and 124 and the first and second cathode electrodes 115 and 125 of the first and second light receiving elements 110 and 120 from the outside.

The side opposite to the recess 126 (main surface side) of the second light receiving element 120 is fixed to the support substrate 102, and the first light receiving element 110 is fixed so as to be accommodated in the recess 126 of the second light receiving element 120. Thus, the light receiving element unit 101 is formed. Accordingly, the light transmitted through the first light receiving region 112 is disposed so as to enter the second light receiving region 122. The second light receiving element 120 in which the first light receiving element 110 is fixed to the recess 126 may be fixed to the support substrate 102.

The back side of the first light receiving element 110 is fixed to the recess 126 with an adhesive 117. The adhesive 117 has, for example, an epoxy resin as a main component, and is transparent to incident light transmitted through the first light receiving element 110. Note that an adhesive may be applied only to the outer edge of the back surface of the first light receiving element 110 so that incident light transmitted through the first light receiving element 110 enters the second light receiving element 120 without passing through the adhesive 117.

The first anode electrode 114 and the first cathode electrode 115 of the first light receiving element 110 are connected to the corresponding intermediate wirings 131 and 132 on the back surface of the second light receiving element 120 by, for example, gold wires 105 and 106, respectively. The intermediate wires 131 and 132 are connected to the corresponding wires 103b and 103c of the support substrate 102 by, for example, gold wires 107 and 108, respectively.

Light enters the first light receiving element 110 from the opposite side of the support substrate 102 to the light receiving element unit 101. In the first light receiving element 110, for example, light having the wavelength in the visible light region and the infrared light region (400 to 1000 nm wavelength) is converted into current and transmitted to the outside as an electrical signal. Light having a wavelength of, for example, 1000 to 1600 nm that transmitted through the first light receiving element 110 is incident to the second light receiving element 120, and this light is converted into an electric current in the second light receiving element 120 to be externally supplied as an electric signal.

The light receiving element unit 101 formed in this way is miniaturized to the same size as the light receiving unit having only the second light receiving element 120 because the first light receiving element 110 is accommodated in the recess 126 of the second light receiving element 120. The light receiving element unit 101 is housed in a case (not shown) provided with a plurality of terminals respectively connected to the plurality of pad portions 104a to 104c of the support substrate 102 and a light incident window, etc. and this light receiving element unit 101 is used for optical communications. The first semiconductor substrate 111 is a gallium nitride-based substrate, and the second semiconductor substrate 121 is a silicon substrate or an indium phosphide substrate so as to receive ultraviolet light and visible light or ultraviolet light and infrared light.

Operations and advantages of the light receiving element unit 1,1A according to the first and second embodiments and the light receiving element unit 101 according to the third embodiment will be explained.

The light receiving element unit 1,1A includes a first light receiving element 10 and a second light receiving element 20. The first light receiving element 10 has a first semiconductor substrate 11 comprises the recess 16 formed on the main surface side from the back surface opposite to the first light receiving region 12. The recess 16 is formed in a concave shape toward the first light receiving region 12. On the other hand, the light receiving element unit 101 includes the first light receiving element 110 and the second light receiving element 120, and the second semiconductor substrate 121 of the second light receiving element 120 has the recess 126 formed in concave shape toward the second light-receiving region 122 on the main surface from the back surface opposite to the second light receiving region 122. The second light receiving element 20 is accommodated in the recess 16, and the first light receiving element 110 is accommodated in the recess 126. In other words, one of the first light receiving element and the second light receiving element has a recess, and the other is accommodated in the recess.

Accordingly, the first light receiving element 10 and the second light receiving element 20 are stacked in order to receive light in a wide wavelength range, and the light receiving element unit 1,1A can be miniaturized while suppressing the thickness. In addition, the first light receiving element 110 and the second light receiving element 120 are stacked, and the light receiving element unit 101 can be reduced in size by suppressing the thickness.

The first light receiving element 10 and the second light receiving element 20 are arranged such that light transmitted through the first light receiving region 12 enters the second light receiving region 22. Further, the first light receiving element 110 and the second light receiving element 120 are arranged so that light transmitted through the first light receiving area 112 enters the second light receiving area 122. Therefore, since the light receiving element units 1,1A and 101 can receive incident light having different wavelengths without diffracting the light, the light receiving element units 1,1A and 101 can be miniaturized.

The first light receiving element 10 has antireflection layers 13 and 18 on the entrance side and the exit side of incident light, respectively. The first light receiving element 110 has antireflection layers 113 and 118 on the entrance side and the exit side of the incident light, respectively. Therefore, the reflection of incident light on the entrance side of the first light receiving elements 10 and 110 is suppressed to secure the light receiving amount of the first light receiving elements 10 and 110 and the light receiving amount of the second light receiving elements 20 and 120, and the amount of light received by the second light receiving elements 20 and 120 can be ensured by suppressing reflection of light on the exit side of the incident light transmitted through the one light receiving elements 10 and 110.

In the first embodiment, the first light receiving element 10 has the recess 16, the recess side thereof is fixed to the support substrate 2, and in the second light receiving element 20 accommodated in the recess 16, the anode electrode 24 and the second cathode electrode 25 are fixed to the corresponding wirings 3a and 3c of the support substrate 2 by the conductive member 27, respectively. Accordingly, the second light receiving element 20 can be accommodated in the recess 16 of the first light receiving element 10 to reduce the size of the light receiving element unit 1, and when the second light receiving element 20 is fixed to the support substrate 2, and is electrically connected simultaneously, and thus manufacturing of the light receiving element unit 1 can be facilitated.

In the second embodiment, the first light receiving element 10 has the recess 16 and the intermediate wirings 31 and 32 connected to the corresponding wirings 3a and 3c of the support substrate 2, and the recess side thereof is fixed to the substrate 2. The second light receiving element 20 accommodated in the recess 16 has the second anode electrode 24 and the second cathode electrode 25 on the main surface side which are fixed with the corresponding intermediate wiring 31,32 of the first light receiving element 10 by the conductive member 27, 32, respectively. Therefore, the second light receiving element 20 can be accommodated in the recess 16 of the first light receiving element 10 to reduce the size of the light receiving element unit 1 and the first light receiving element 10 to which the second light receiving element 20 is fixed is fixed to the support substrate 2 and electrically connected at the same time, the light receiving element unit 1 can be easily manufactured.

In the third embodiment, the second light receiving element 120 has a concave recess 126, and the side opposite to the recess 126 (main surface side) is fixed to the support substrate 102. The first light receiving element 110 has the back surface thereof fixed to the recess 126, and the first anode electrode 114 and the first cathode electrode 115 on the main surface side are connected to corresponding intermediate wires 131 and 132 formed on the second light receiving element 120 by the gold wires 105 and 106. Therefore, the first light receiving element 110 can be accommodated in the recess 126 of the second light receiving element 120, and the light receiving element unit 101 can be miniaturized.

The first semiconductor substrate is a silicon substrate (Si substrates 11, 111), and the second semiconductor substrate is an indium phosphide substrate (InP substrates 21, 121). Therefore, the first light receiving elements 10 and 110 receive incident light in the visible light region without diffracting the incident light, and the second light receiving elements 20 and 120 receive the light of the infrared region transmitted through the first light receiving elements 10 and 110, and the light receiving element units 1,1A and 101 can be miniaturized.

In addition, for a person skilled in the art, the present invention can be implemented in various different modes by including various other changes to the embodiments described above without deviating from the spirit of the present invention, and the present invention is to be considered as including variant embodiments of this type.

DESCRIPTION OF REFERENCE NUMERALS 1,101: light receiving element unit
2,102: support substrate
3a~3c, 103a~103c: wiring
4a~4c, 104a~104c: pad
10,110: first light receiving element
11, 111: Si substrate (first semiconductor substrate)
12,112: first light receiving area
12a, 112a: p type diffusion region
13, 18, 113,118: antireflection layer
14, 114: first anode electrode
15, 115: first cathode electrode
16: recess
17, 27, 127: conductive adhesive
20, 120: second light receiving element
21, 121: InP substrate (second semiconductor substrate)
22, 122: second light receiving area
22a, 122a: p type region
23, 28, 123, 128: antireflection layer
24, 124: second anode electrode
25, 125: second cathode electrode
31, 32, 131, 132: intermediate wiring
117: adhesive
126: recess

The invention claimed is:

1. A light receiving element unit comprising a first light receiving element having a light receiving region on a first main surface side of a first semiconductor substrate; a second light receiving element having a light receiving region on a second main surface side of the second semiconductor substrate; and a support substrate having wirings for electrically connecting the first light receiving element and the second light receiving element to an outside, wherein one of the first light receiving element and the second light receiving element has a recess formed in a concave shape from a back surface opposite to the light receiving region toward the light receiving region, and the other is accommodated in the recess.

2. The light receiving element unit according to claim 1, wherein the first light receiving element and the second light receiving element are arranged such that light transmitted through the light receiving region of the first light receiving element is incident to the light receiving region of the second light receiving element.

3. The light receiving element unit according to claim 1, wherein the first light receiving element comprises an antireflection layer on an entrance side and an exit side of incident light, respectively.

4. The light receiving element unit according to claim 1, wherein the first light receiving element has the recess, and a recess side of the first light receiving element is fixed to the support substrate,
the second light receiving element comprises electrodes on the second main surface of the second semiconductor substrate, and the electrodes are fixed to corresponding wirings of the support substrate by solidified conductive member.

5. The light receiving element unit according to claim 1, wherein the first light receiving element has the recess and intermediate wirings formed on a recess side surface and connected to corresponding wirings of the support substrate, and the recess side surface is fixed to the support substrate,
the second light receiving element has electrodes on the second main surface of the second semiconductor substrate, and the electrodes are fixed to corresponding intermediate wirings of the first light receiving element by a conductive member solidified.

6. The light receiving element unit according to claim 1, wherein the second light receiving element has the recess and intermediate wirings formed on a recess side surface and connected to corresponding wirings of the support substrate by conductive wires, and an opposite side surface of the recess is fixed to the support substrate,
the first light receiving element has electrodes on the first main surface of the first semiconductor substrate, and the electrodes are connected to corresponding intermediate wirings by conductive wires in a state where an opposite side surface of the electrodes is fixed to the recess side surface.

7. The light receiving element unit according to claim 1, wherein the first semiconductor substrate is a silicon substrate, and the second semiconductor substrate is an indium phosphide substrate.

* * * * *